(12) United States Patent
Loibl

(10) Patent No.: US 9,928,909 B1
(45) Date of Patent: Mar. 27, 2018

(54) RRAM RESET OF LOW RESISTIVE CELLS

(71) Applicant: Infineon Technologies AG, Neubiberg (DE)

(72) Inventor: Ulrich Loibl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/347,319

(22) Filed: Nov. 9, 2016

(51) Int. Cl.
*G11C 13/00* (2006.01)

(52) U.S. Cl.
CPC ........ *G11C 13/0097* (2013.01); *G11C 13/004* (2013.01)

(58) Field of Classification Search
None
See application file for complete search history.

(56) References Cited

U.S. PATENT DOCUMENTS

| | | | | |
|---|---|---|---|---|
| 6,574,145 B2* | 6/2003 | Kleveland | ............ | G11C 7/062 365/185.14 |
| 2004/0120200 A1* | 6/2004 | Gogl | .................. | G11C 7/067 365/210.1 |
| 2008/0151652 A1* | 6/2008 | Oh | ................... | G11C 5/145 365/189.14 |
| 2011/0199812 A1* | 8/2011 | Kitagawa | ............ | G11C 7/1048 365/148 |
| 2015/0036421 A1* | 2/2015 | Kim | .................. | G11C 11/1673 365/158 |

* cited by examiner

*Primary Examiner* — J. H. Hur
(74) *Attorney, Agent, or Firm* — Schiff Hardin LLP

(57) ABSTRACT

A circuit having a Resistive Random Access Memory (RRAM) cell coupled between a supply voltage and a sense node; a first transistor coupled between the sense node and a source voltage; and a sub-circuit configured to have a sense voltage at the sense node be lower than a bias voltage at the gate of the first transistor.

12 Claims, 5 Drawing Sheets

Figure 6
conventional
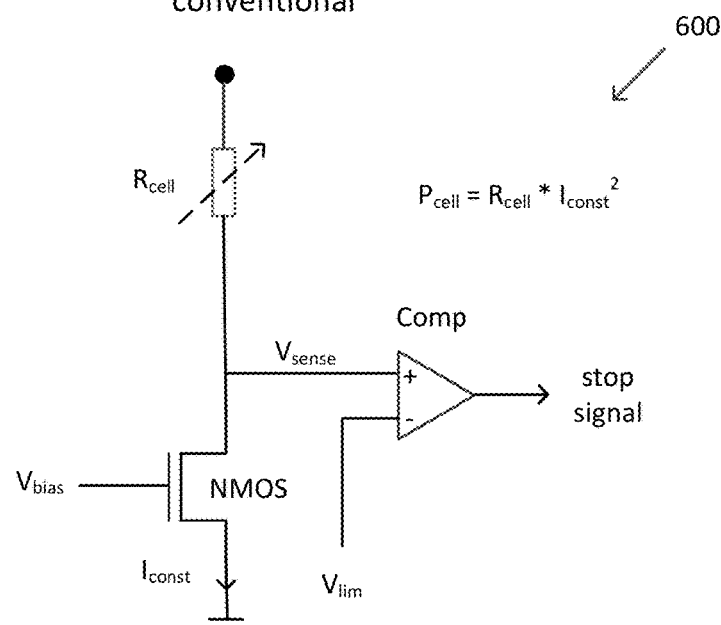

RRAM RESET OF LOW RESISTIVE CELLS

BACKGROUND

Resistive Random Access Memory (RRAM) is a non-volatile memory in which a dielectric that is normally insulating, is configured to conduct after application of a sufficiently high voltage. The forming of a conduction path typically requires a relatively high voltage. Once the path is formed in the dielectric, the path may be "reset" (broken, to provide high resistance) or "set" (re-formed, to provide a low resistance) by an appropriately applied voltage.

Cell distributions require a sufficient gap (read window) between different cell states to enable an accurate reading. Cell distributions are described in terms of cell resistance.

FIG. 5 is a graph 500 of number of cells versus cell resistance, that is, a number of occurrences leading to a cell distribution of cells showing a value "1" and cells showing a value "0". Changing a memory cell from one state to the other across the read window and its borders is called "set" (to a logical "1") or "reset" (to a logical "0").

FIG. 6 is a conventional circuit 600. The simplest way to observe a value of an RRAM cell $R_{cell}$ is to couple a constant current supply $I_{const}$ and detect a voltage drop. This is realized by an additional transistor NMOS coupled in series with the RRAM cell $R_{cell}$, and a comparator Comp configured to generate a stop signal when the read window border, shown in FIG. 5, is crossed. The necessary power $P_{cell}$ for changing the resistor value is adjusted by a constant current $I_{const}$. The transistor bias voltage $V_{bias}$ and the constant current $I_{const}$ are linked via the transistor characteristic in saturation mode.

With the circuit 600, an RRAM cell state can be shifted across the lower read window border A during "set" with sufficient power. On the other hand, an RRAM cell $R_{cell}$ in very low resistive state, that is, well below the lower read window border A, does not receive enough power to be returned to the other state during "reset". This is due to a small diffusion coefficient. Even with other constant current $I_{const}$ settings, which are equal to bias voltage $V_{bias}$ settings, the characteristics show a low power region for low RRAM cell resistances.

BRIEF DESCRIPTION OF THE DRAWINGS

FIG. 6 is a conventional circuit.

DETAILED DESCRIPTION

The present disclosure is directed to a Resistive Random Access Memory (RRAM) "reset" of low resistive cells.

Figure 1:
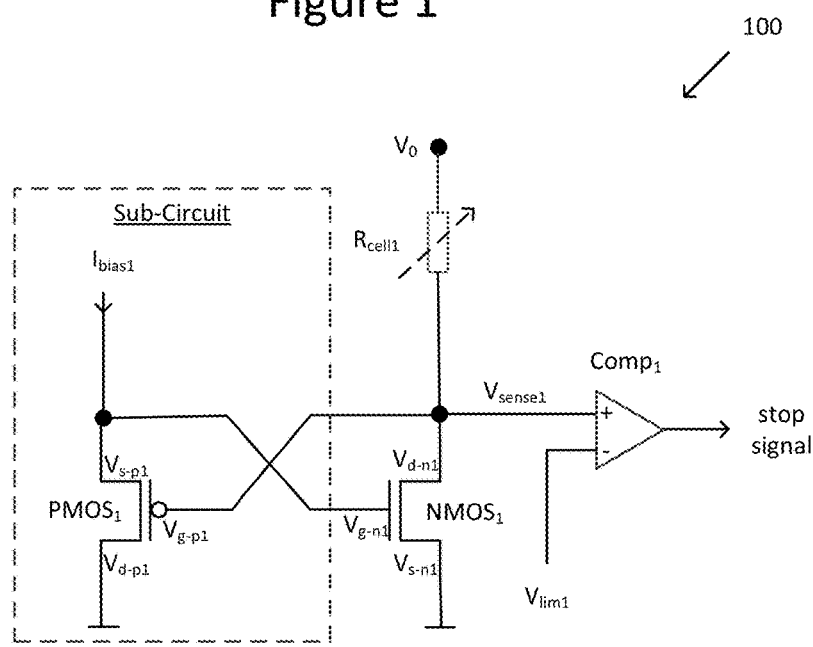
FIG. 1 illustrates a circuit in accordance with an embodiment of the disclosure.

FIG. 1 illustrates a circuit 100 in accordance with an embodiment of the disclosure.

The circuit 100 comprises an RRAM cell $R_{cell1}$, an n-channel transistor $NMOS_1$ (first transistor), a p-channel transistor $PMOS_1$ (second transistor; sub-circuit), a comparator $Comp_1$, and a bias current source $I_{bias1}$.

The RRAM cell $R_{cell1}$ is coupled between a supply voltage $V_0$ and a sense node. The n-channel transistor $NMOS_1$ is coupled between the sense node and a source voltage. The sub-circuit is configured to set a sense voltage $V_{sense1}$ at the sense node to be lower than a bias voltage at the gate g-n1 of the n-channel transistor $NMOS_1$.

The sub-circuit comprises the p-channel transistor $PMOS_1$, which has a polarity that is opposite that of the n-channel transistor $NMOS_1$. The gate g-p1 of the p-channel transistor $PMOS_1$ is coupled to the sense node, and the drain d-n1 of the n-channel transistor $NMOS_1$ (drain voltage $V_{d-n1}$=sense voltage $V_{sense1}$), and the source s-p1 of the p-channel transistor PMOS1 is coupled to the gate g-n1 of the n-channel transistor $NMOS_1$; this forces the sense voltage $V_{sense1}$ to be lower than the gate voltage $V_{g-n1}$ of the n-channel transistor $NMOS_1$. Therefore the drain voltage $V_{d-n1}$ and the gate voltage $V_{g-n1}$ of the n-channel transistor $NMOS_1$ are strongly coupled.

If the n-channel transistor $NMOS_1$'s gate voltage $V_{g-n1}$ has to increase in order to manage current, the n-channel transistor $NMOS_1$'s drain voltage $V_{d-n1}$ (=sense voltage $V_{sense1}$), does the same, but with a lower potential, such as in the order of some hundred millivolt. The goal is to provide as much power as possible to the memory cell $R_{cell1}$.

The sub-circuit also comprises a bias current source $I_{bias1}$ coupled between the supply voltage $V_0$ and the source s-p1 of the p-channel transistor $PMOS_1$. The bias current $I_{bias1}$ through the p-channel transistor $PMOS_1$ results in the gate voltage $V_{g-p1}$ of the p-channel transistor $PMOS_1$ being lower than the source voltage $V_{s-p1}$ if the p-channel transistor $PMOS_1$.

The comparator $Comp_1$ has a first input coupled to the sense node and a second input coupled to a limit voltage $V_{lim1}$. The comparator $Comp_1$ is configured to compare the sense voltage $V_{sense1}$ with the limit voltage $V_{lim1}$. When the sense voltage $V_{sense1}$ becomes less than the limit voltage $V_{lim1}$, the RRAM cell $R_{cell1}$ is reset. When the sense voltage $V_{sense1}$ becomes greater than the limit voltage $V_{lim1}$, the RRAM cell $R_{cell1}$ is set.

Figure 2A:
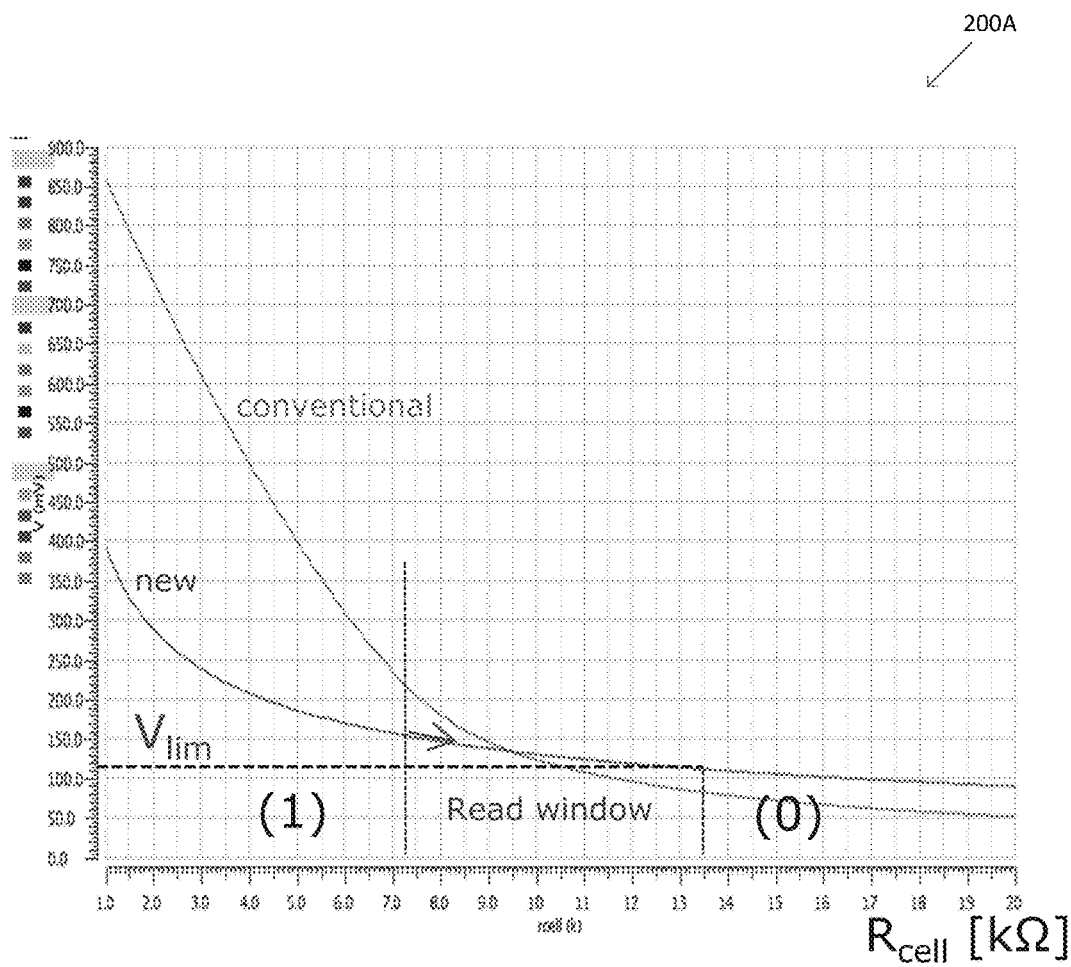
FIGS. 2A illustrates a graph of a sense voltage versus cell resistance.
Figure 2B:
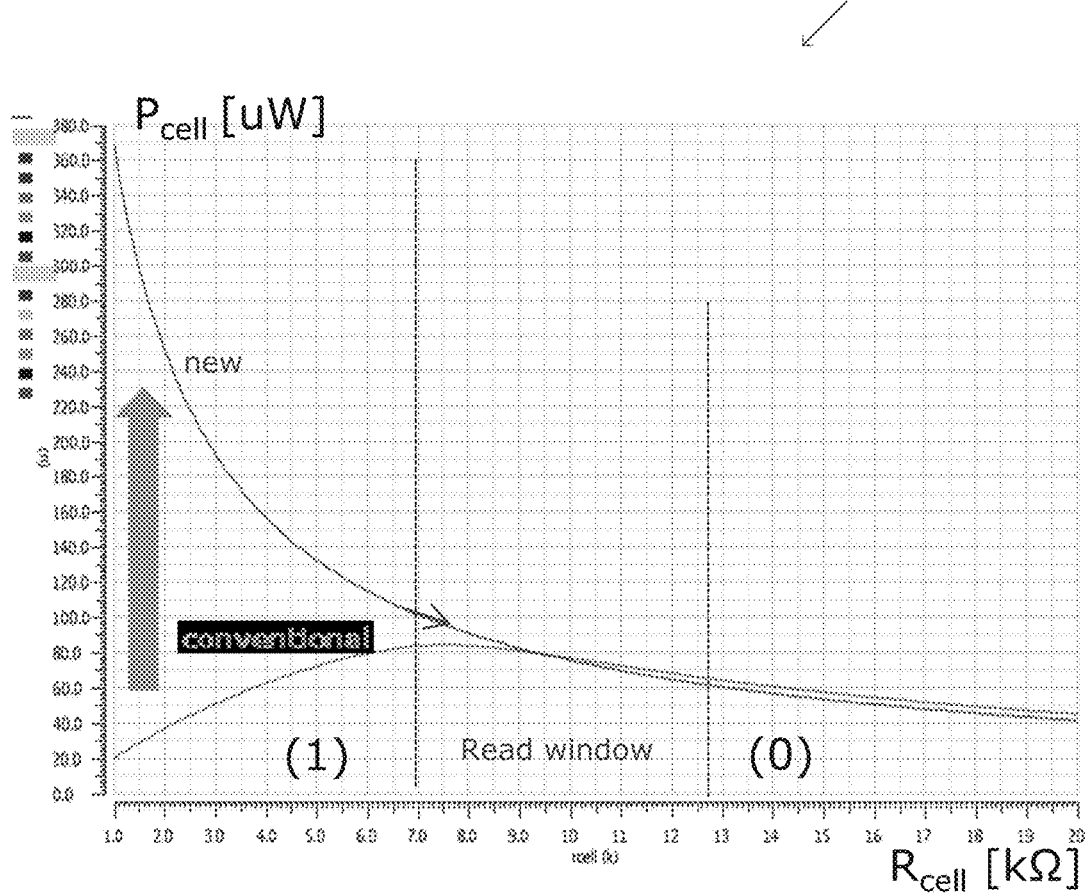
FIG. 2B illustrates a graph of cell power versus cell resistance.

FIG. 2A illustrates a graph 200A of a sense voltage versus cell resistance, and FIG. 2B illustrates a graph 200B of cell power versus cell resistance.

As can be seen in these figures, this two-transistor approach of this disclosure provides higher power for low resistive RRAM cells to transition the RRAM cells to the high resistive region during the "reset". There is as much drop of the sense voltage $V_{sense1}$ as possible at the memory cell $R_{cell1}$ without abandoning measurement options, that is, when the sense voltage $V_{sense1}$ crosses the limit voltage $V_{lim1}$.

Figure 3:
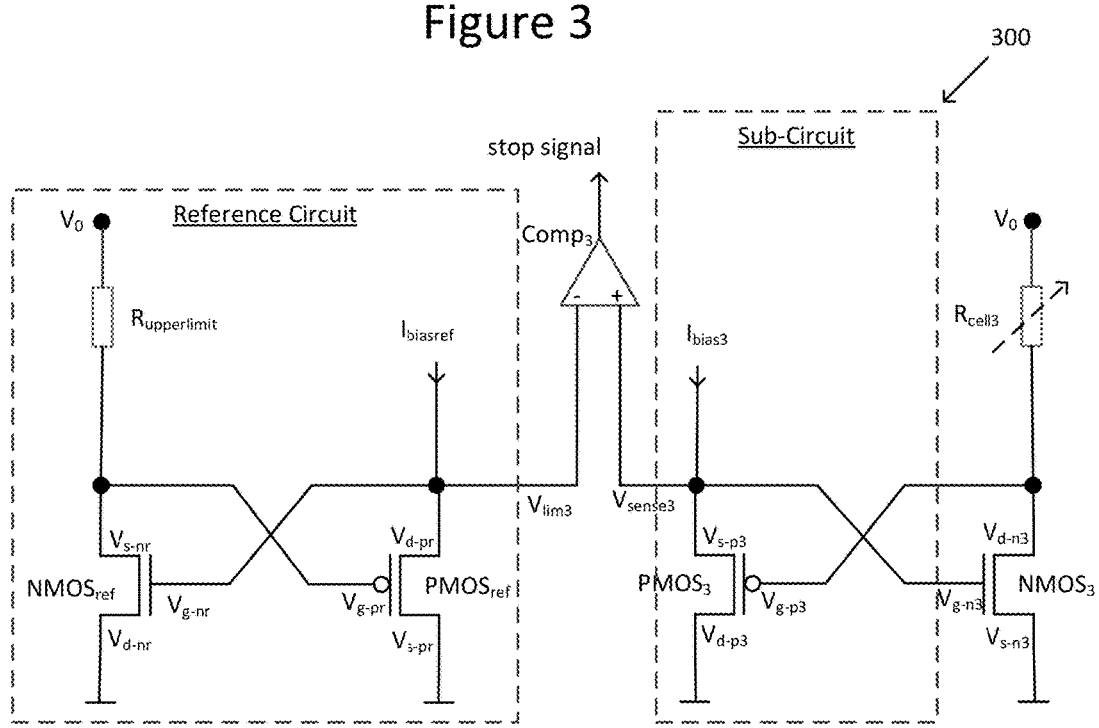
FIG. 3 illustrates a circuit in accordance with another embodiment of the disclosure.

FIG. 3 illustrates a circuit 300 in accordance with another embodiment of the disclosure. This circuit 300 is similar to the circuit 100 of FIG. 1, with a main difference being that the limit voltage $V_{lim3}$ is generated by a reference circuit; the comparator $Comp_3$ can therefore have a changeable limit voltage $V_{lim3}$ generated by the reference circuit with a fixed resistor rather than a variable cell.

The circuit 300, similar to the circuit 100 of FIG. 1, comprises an RRAM cell $R_{cell3}$, an n-channel transistor $NMOS_3$ (first transistor), a p-channel transistor $PMOS_3$ (second transistor; sub-circuit), a comparator $Comp_3$, and a bias current source $I_{bias3}$ (first bias current source). The circuit 300 also comprises the reference circuit.

The RRAM cell $R_{cell3}$ is coupled between a supply voltage $V_0$ and a drain d-n3 of the n-channel transistor NMOS$_3$, which has its source s-n3 coupled to a source voltage. A gate g-n3 of the n-channel transistor NMOS$_3$ is coupled to a sense node.

The sub-circuit comprises the p-channel transistor PMOS$_3$, which has a polarity that is opposite that of the n-channel transistor NMOS$_3$. The gate g-p3 of the p-channel transistor PMOS$_3$ is coupled to the drain d-n3 of the n-channel transistor NMOS$_3$, and the source s-p3 of the p-channel transistor PMOS$_3$ is coupled to both the gate g-n3 of the n-channel transistor NMOS$_3$ and the sense node The sub-circuit also comprises a bias current source I$_{bias3}$ coupled between the supply voltage V$_0$ and the source s-p3 of the p-channel transistor PMOS$_3$. The bias current source I$_{bias3}$ results in the gate voltage g-p3 of the p-channel transistor PMOS$_3$ being lower than the source voltage s-p3 of the p-channel transistor PMOS$_3$.

The comparator Comp$_3$ has a first input coupled to the sense node, which is also the gate g-n3 of the n-channel transistor NMOS$_3$, and a second input coupled to a limit voltage V$_{lim3}$, which as explained below, is output by the reference circuit. The comparator Comp$_3$ is configured to compare the gate voltage V$_{g-n3}$ with the limit voltage V$_{lim3}$. When the gate voltage V$_{gn-3}$ of the n-channel transistor NMOS$_3$ becomes greater than the limit voltage V$_{lim3}$, the RRAM cell R$_{cell3}$ is "set". When the gate voltage Vg-n3 of the n-channel transistor NMOS$_3$ becomes less than the limit voltage V$_{lim3}$, the RRAM cell R$_{cell3}$ is "reset".

The sense voltage V$_{sense3}$ is now at the gate g-n3 of the n-channel transistor NMOS$_3$, and differs from V$_{sense1}$, which was at the drain d-n1. Because the gate voltage Vg-n3 is higher than the drain voltage V$_{d-n3}$, the sense voltage V$_{sense3}$ is easier to detect. A difference between the gate voltage V$_{g-n3}$ and the drain voltage V$_{d-n3}$ is adjusted by the p-channel transistor PMOS$_3$ and an appropriate bfirst ias current I$_{bias3}$.

Because the gate voltage V$_{gn-3}$ and the drain voltage V$_{d-n3}$ of the n-channel transistor NMOS$_3$ increase and decrease by a same amount depending on the current, or rather with the resistance of the RRAM cell R$_{cell3}$, the voltage can not only be measured on the drain side of the n-channel transistor NMOS$_3$, but alternatively on the gate side of the n-channel transistor NMOS$_3$ where the voltage is much higher and can be processed more easily by the comparator Comp$_3$.

The reference circuit is configured to output the limit voltage V$_{lim3}$. The reference circuit comprises a p-channel transistor PMOS$_{ref}$ (third transistor), an n-channel transistor NMOS$_{ref}$ (fourth transistor), a resistor R$_{upperlimit}$, and a bias current source I$_{biasref}$ (second bias current source). The reference circuit improves read accuracy because the same effects, such as temperature or power supply, are applied to all circuit elements.

The p-channel transistor PMOS$_{ref}$ is coupled between the second input of the comparator Comp$_3$ and the source voltage, and has a same polarity as the p-channel transistor PMOS$_3$. The n-channel transistor NMOS$_{ref}$ is coupled between the resistor R$_{upperlimit}$ and the source voltage, has a gate g-nr coupled to the second input of the comparator Comp3, and has a same polarity as the n-channel transistor NMOS$_3$.

The resistor R$_{upperlimit}$ is coupled between the supply voltage V$_0$ and the source s-nr of the n-channel transistor NMOS$_{ref}$. The resistor value of the resistor R$_{upperlimit}$ represents an upper limit B of a resistance read window between "set" and "reset" states of the RRAM cell R$_{cell3}$. The bias current source I$_{biasref}$ is coupled between the supply voltage V$_0$ and the drain d-pr of the p-channel transistor PMOS$_{ref}$. The sense voltage V$_{sense3}$ at the sense node is linked to a resistance of the RRAM cell R$_{cell3}$.

Figure 4:
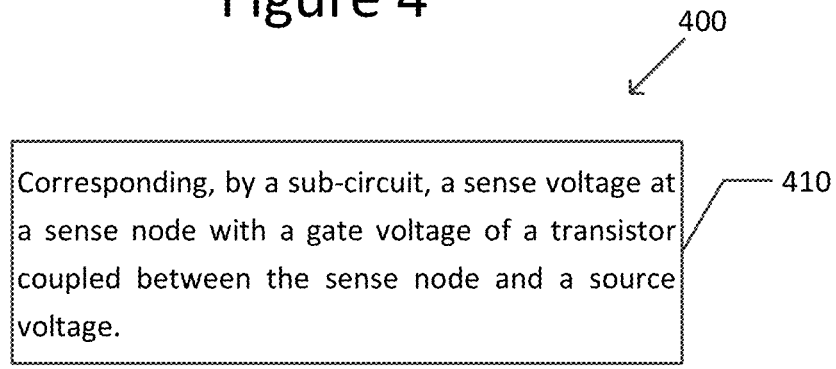
FIG. 4 illustrates a flowchart of a method in accordance with an embodiment of the disclosure.
Figure 5:
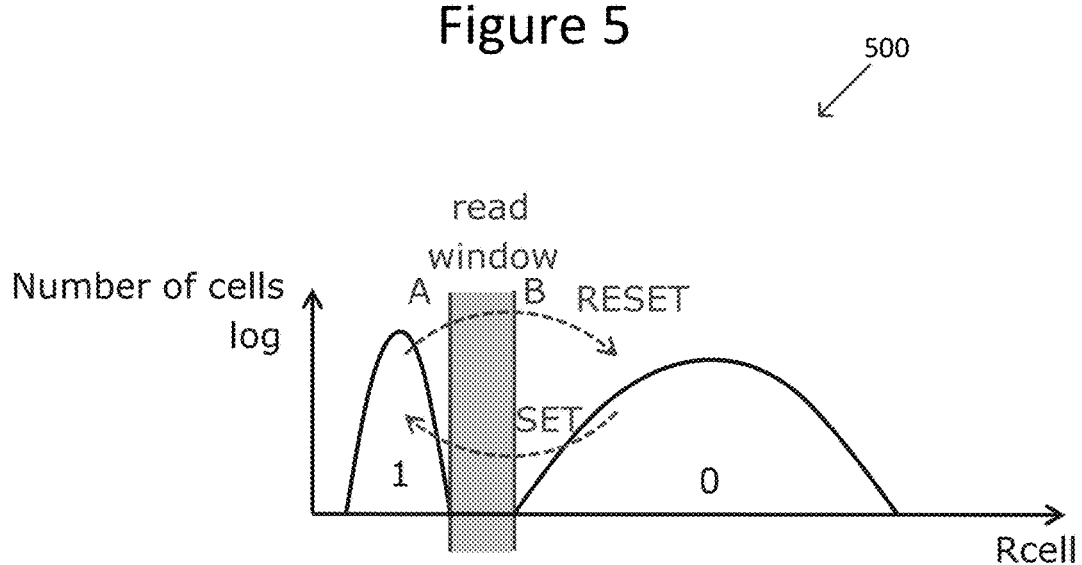
FIG. 5 is a graph of number of cells versus cell resistance.

FIG. 4 illustrates a flowchart 400 of a method in accordance with an embodiment of the disclosure. This a one-step (Step 410) method in which the sub-circuit corresponds the sense voltage V$_{sense1,3}$ at the sense node with the gate voltage V$_{g-n1,3}$ of the first transistor NMOS$_{1,3}$ coupled between the sense node and the source voltage.

The conventional circuit 600, described in the background section above, requires two or more steps. More specifically, the conventional circuit 600 has a very low resistance RRAM cell R$_{cell}$. It is thus necessary to apply a high bias voltage V$_{bias}$ to the gate of the n-channel transistor NMOS to cover the constant current I$_{const}$ and to generate enough power to change the state of the RRAM cell R$_{cell}$. When the RRAM cell R$_{cell}$ begins to change, its current decreases, but the bias voltage V$_{bias}$ is maintained high and the sense voltage V$_{sense}$ becomes low very quickly. The process therefore has to be stopped between. A new bias voltage V$_{bias}$ has to be adjusted and the process started again. This process has to be repeated several times until the RRAM cell R$_{cell}$ reaches its desired value.

On the other hand, the circuits 100, 300 of this disclosure offer a significantly faster "reset" procedure using only one step to shift an RRAM cell R$_{cell1,3}$ from a low resistive state to a high resistive state. The bias voltage V$_{bias}$ is dependent on the current, because the sense voltage V$_{sense}$ strongly correlates with the bias voltage V$_{bias}$ by the second transistor (p-channel transistor PMOS$_{1,3}$) and the sense voltage V$_{sense1,3}$ is linked to the resistance of the RRAM cell R$_{cell1,3}$. One step means there is only one setting and one start. Also, provision of sufficient power to the RRAM cell Rcell$_{1,3}$, even when in a very low resistive state, is guaranteed.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein. For example, bipolar transistors (e.g., PNP or NPN) can be used instead of MOS transistors. A PNP may be used instead of NPN, and a PMOS may be used instead of NMOS. Accordingly, it is intended that the disclosure be limited only in terms of the appended claims.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A circuit, comprising:
    a Resistive Random Access Memory (RRAM) cell coupled between a supply voltage and a sense node;
    a first transistor coupled between the sense node and a source voltage; and a sub-circuit configured to set a sense voltage at the sense node to be lower than a bias voltage at a gate of the first transistor, wherein the sub-circuit comprises a second transistor having a polarity that is opposite that of the first transistor, and a gate of the second transistor is coupled to the sense node,
wherein the first transistor is an NMOS transistor, the second transistor is a PMOS transistor, the gate of the PMOS transistor is coupled to the drain of the NMOS transistor, and the source of the PMOS transistor is coupled to the gate of the NMOS transistor.

2. The circuit of claim 1, where:
the sub-circuit comprises a first bias current source coupled between the supply voltage and the source of the PMOS transistor, and
the gate voltage of the PMOS transistor is lower than the source voltage of the PMOS transistor.

3. The circuit of claim 1, further comprising:
a comparator having a first input coupled to the sense node and a second input coupled to a limit voltage, and configured to compare the sense voltage with the limit voltage,
wherein when the sense voltage becomes less than the limit voltage, the RRAM cell is reset.

4. The circuit of claim 3, wherein when the sense voltage becomes greater than the limit voltage, the RRAM cell is set.

5. The circuit of claim 1, further comprising:
a comparator having a first input coupled to a drain of the first transistor and a second input coupled to a limit voltage, and configured to compare the drain voltage with the limit voltage.

6. The circuit of claim 5, wherein
when the drain voltage of the first transistor becomes greater than the limit voltage, the RRAM cell is set, and
when the drain voltage of the first transistor becomes less than the limit voltage, the RRAM cell is reset.

7. A circuit, comprising:
a Resistive Random Access Memory (RRAM) cell coupled between a supply voltage and a sense node;
a first transistor coupled between the sense node and a source voltage;
a sub-circuit configured to set a sense voltage at the sens node to be lower than a bias voltage at a gate of the first transistor, wherein the sub-circuit comprises a second transistor having a polarity that is opposite that of the first transistor, and a gate of the second transistor is coupled to the sense node;
a reference circuit configured to output a limit voltage; and
a comparator having a first input coupled to a gate of the first transistor and a second input coupled to the output of the reference circuit, and configured to compare the gate voltage with the limit voltage.

8. The circuit of claim 7, wherein
when the gate voltage of the first transistor becomes less than the limit voltage, the RRAM cell is reset, and
when the gate voltage of the first transistor becomes greater than the limit voltage, the RRAM cell is set.

9. The circuit of claim 8, wherein the reference circuit comprises:
a third transistor coupled between the second input of the comparator and the source voltage, and having a same polarity as the second transistor;
a fourth transistor coupled between the source voltage and a resistor, having a gate coupled to the second input of the comparator, and having a same polarity as the first transistor;
the resistor coupled between the supply voltage and the fourth transistor,
wherein a resistor value of the resistor represents an upper limit of a resistance window between set and reset states of the RRAM cell.

10. The circuit of claim 9, wherein the reference circuit further comprises:
a second bias current source coupled between the supply voltage and the third transistor.

11. The circuit of claim 9, wherein:
the first and fourth transistors are NMOS transistors, and
the second and third transistors are PMOS transistors.

12. The circuit of claim 1,
wherein the sense voltage at the sense node is linked to a resistance of the RRAM cell.

* * * * *